United States Patent [19]

Scheider

[11] Patent Number: 5,446,326
[45] Date of Patent: Aug. 29, 1995

[54] VENDING MACHINE GEARMOTOR

[75] Inventor: Merwin R. Scheider, Crystal Lake, Ill.

[73] Assignee: Barber-Colman Company, Rockford, Ill.

[21] Appl. No.: 238,235

[22] Filed: May 4, 1994

[51] Int. Cl.[6] .................... H02K 7/116; H02K 11/00
[52] U.S. Cl. .................... 310/83; 310/68 R; 310/71; 310/89
[58] Field of Search .............. 310/42, 45, 68 R, 71, 310/83, 85, 89, 91, DIG. 6

[56] References Cited

U.S. PATENT DOCUMENTS

| | | | |
|---|---|---|---|
| 3,898,488 | 8/1975 | Erwin et al. | 310/83 |
| 4,250,420 | 2/1981 | Grah et al. | 310/83 |
| 4,636,595 | 1/1987 | Smock et al. | 200/38 R |
| 5,218,255 | 6/1993 | Horiguchi | 310/71 |
| 5,221,869 | 6/1993 | Williams et al. | 310/83 |
| 5,256,921 | 10/1993 | Pruis et al. | 310/68 B |
| 5,343,774 | 9/1994 | Jang | 74/421 A |

Primary Examiner—Steven L. Stephan
Assistant Examiner—D. R. Haszko
Attorney, Agent, or Firm—Leydig, Voit & Mayer, Ltd.

[57] ABSTRACT

A control circuit for a gearmotor is located internal to a plastic gearbox to reduce handling damage and damage resulting from exposure to the environment. The control circuit includes a metal track which provides an electrical conductive path for input power to an electric motor and electrical components and thereby eliminates the need for a printed circuit board. The metal track includes a plurality of alternative control circuits paths, the appropriate circuit being chosen during assembly of the gearmotor by selectively piercing knock-out tabs in the metal track. The metal track includes locking receptacles for receiving switch and d.c. motor electrical terminals and further includes crimping receptacles for receiving electrical component lead wires. The metal track is located on the internal surface of the plastic gearbox cover by integrally molded posts and is secured to the cover by ultrasonically or heat staking the posts.

6 Claims, 2 Drawing Sheets

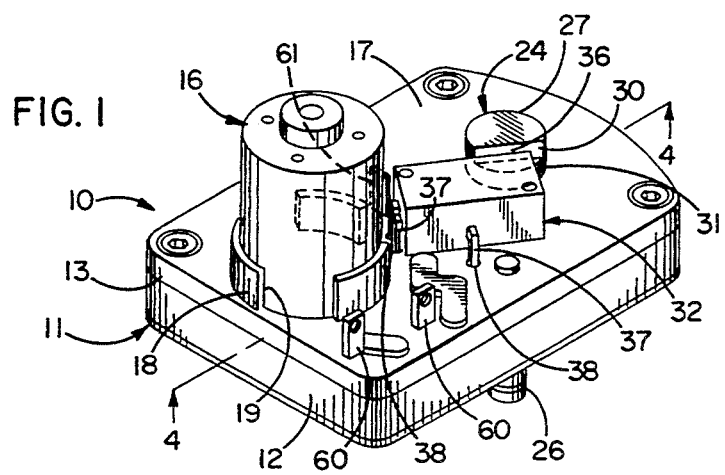
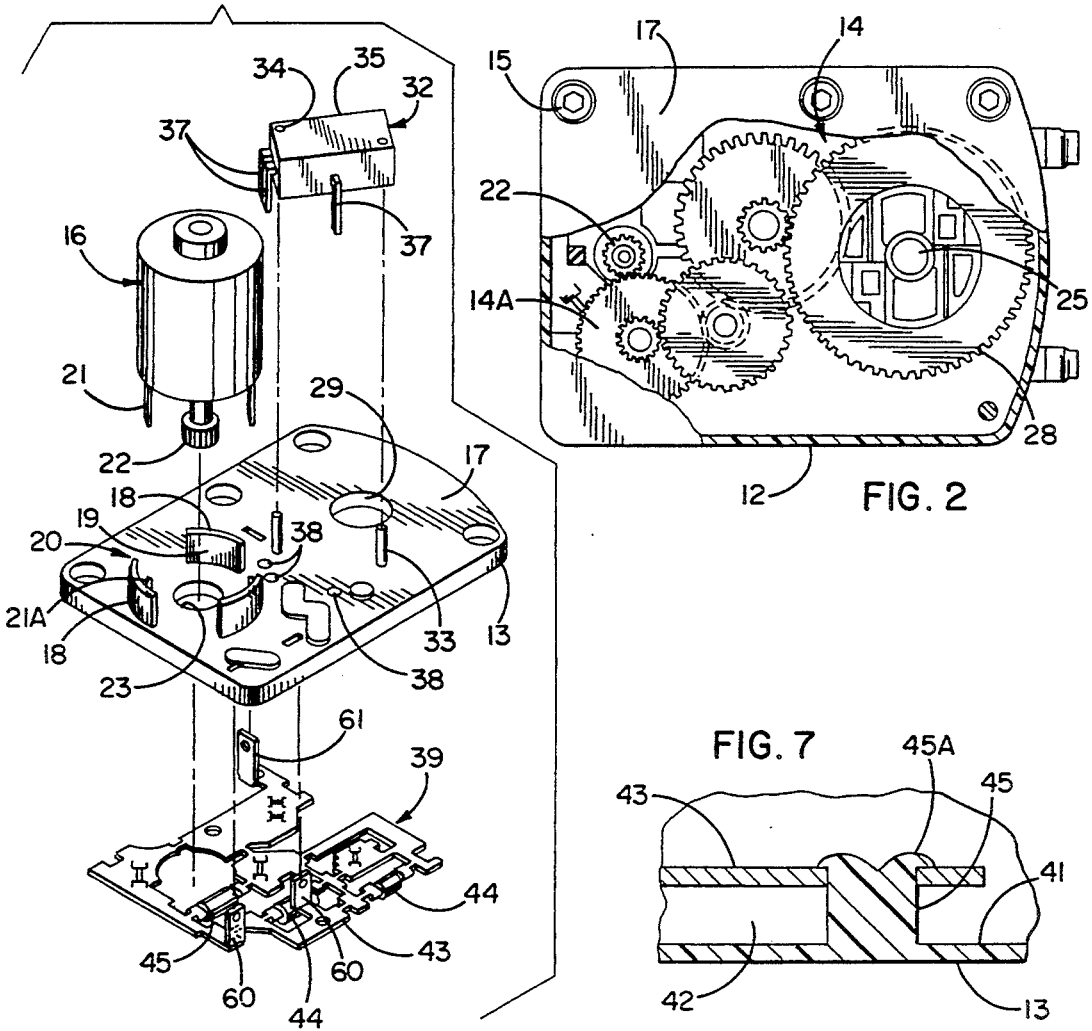

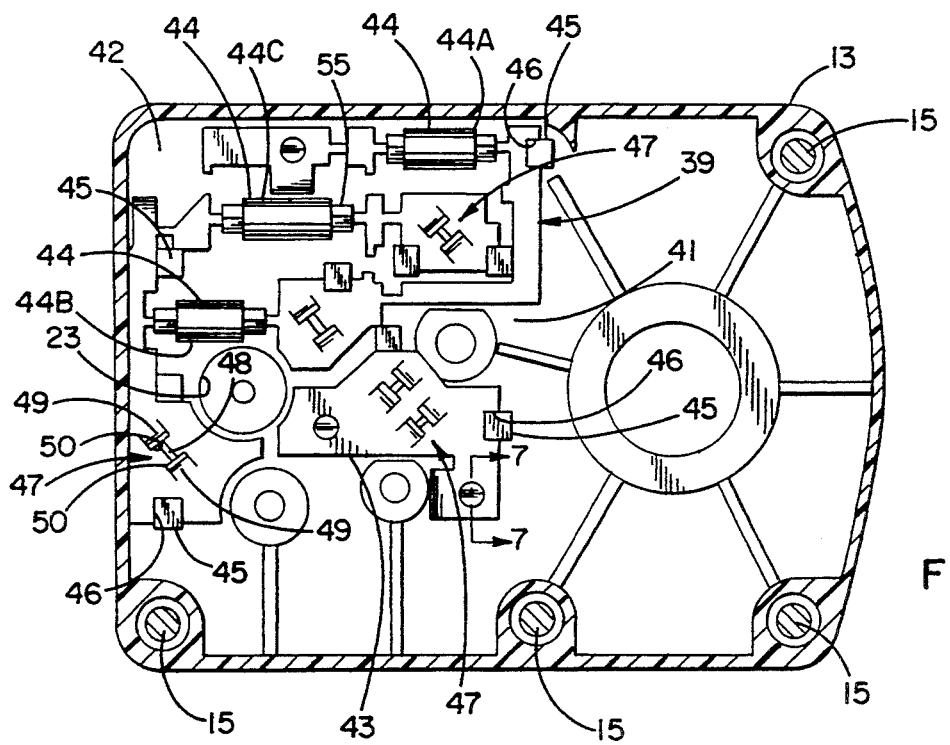
FIG. 4
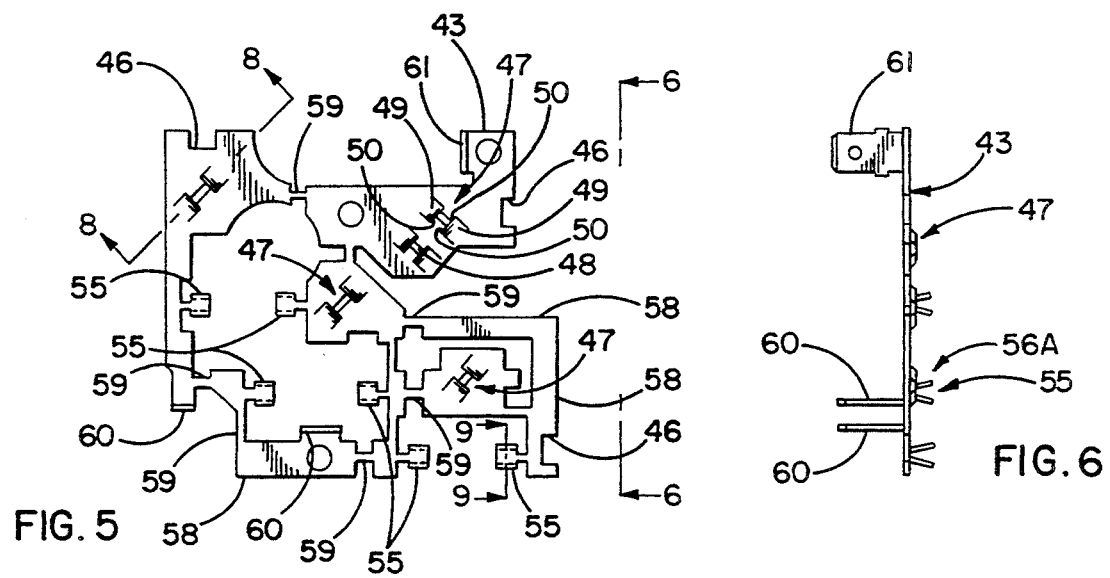
FIG. 5
FIG. 6
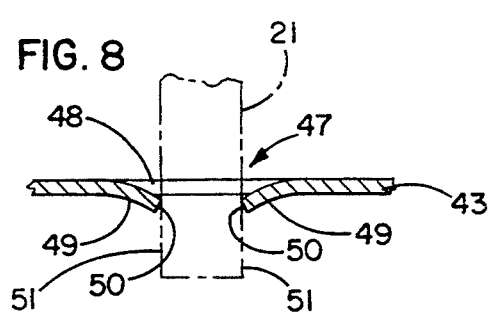
FIG. 8
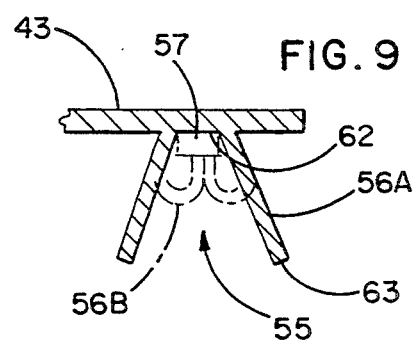
FIG. 9

VENDING MACHINE GEARMOTOR

Background of the Invention

This invention relates generally to a control circuit for a gearmotor and, more particularly, to a control circuit for a gearmotor which is particularly useful in coin-operated vending machines that dispense candy, chips and other snack foods.

Snack-food vending machines typically use helical feeders to dispense selected snacks into a dispensing bin. The helical feeders are directly coupled to and driven by fractional horsepower d.c. electric gearmotors. When a particular snack is selected, the vending machine control circuit supplies electric power to the input terminals of the appropriate gearmotor to energize the electric motor. The gearmotor then turns the helical feeder, thereby dispensing the selected snack. A cam actuated switch mechanism, mounted on the gearmotor, signals the vending machine control circuit when the output shaft has rotated through one revolution. The vending machine control circuit then de-energizes the electric motor.

Electrical components are used in the gearmotor control circuit for a variety of reasons. A blocking diode may be included to protect the gearmotor from the effects of reverse polarity. Noise suppression diodes or capacitors may also be included in the circuit. The switch mechanism may signal the vending machine control circuit that the feeder has traveled through one revolution by opening, or shorting, a line that the vending machine control circuit monitors. Alternately, the switch may cause a capacitor in the gearmotor control circuit to discharge, thereby signaling the vending machine control circuit to de-energize the gearmotor. It is evident that the variety of vending machine control circuit interface requirements necessitates an equal variety of gearmotor control circuit configurations.

In a conventional gearmotor, the electrical components are mounted on a printed circuit board which is located on the casing of the electric motor. This approach suffers from several significant drawbacks. First, the printed circuit board is susceptible to handling damage before and as the gearmotor is installed in a vending machine. Second, the printed circuit board is susceptible to damage due to exposure to the environment. Further, when the gearmotor is installed in a vending machine, it is located in the rear of the machine with the printed circuit board in close proximity with the flexible metal back of the vending machine. In this location, the printed circuit board is susceptible to electrical shorting with the metal back of the vending machine.

Summary of the Invention

The general aim of the present invention is to provide a control circuit with enhanced reliability for use in vending machine gearmotors by locating the control circuit internally of the gearbox housing.

A more detailed objective is to enhance gearmotor reliability by eliminating the potential for an electrical short between the control circuit and the metal back of the vending machine.

Another detailed objective is to enhance the gearmotor reliability by reducing the potential for damage to the control circuit from handling and exposure to the environment.

A second general objective of the present invention is to provide a gearmotor with enhanced reliability at a lower cost by eliminating components and by reducing time-intensive soldering during assembly of the gearmotor.

A more detailed objective is to eliminate the printed-circuit board and various mechanical fasteners from the gearmotor assembly.

Another detailed objective is to provide a common metal track which may be used to establish alternate control circuits.

Still another detailed objective is to configure electrical connections for either a mechanical fastening or a crimping process.

These and other objects and advantages of the invention will become more apparent from the following detailed description when taken in conjunction with the accompanying drawings.

BRIEF DESCRIPTION OF THE DRAWINGS

FIG. 1 is a perspective view of a new and improved electric gearmotor incorporating the unique features of the present invention.

FIG. 2 is a top view of the gearmotor, with the cover substantially broken away and showing the internal gear train.

FIG. 3 is an exploded perspective view of the control circuit and related components showing the interface with the gearbox cover.

FIG. 4 is an enlarged cross-sectional view taken substantially along the line 4—4 of FIG. 1.

FIG. 5 is an enlarged plan view of the metal track.

FIG. 6 is an enlarged end view of the metal track as seen along the line 6—6 of FIG. 5.

FIG. 7 is an enlarged fragmentary view showing the metal track secured to the cover by plastic posts.

FIG. 8 is an enlarged fragmentary cross-sectional view taken along the line 8—8 of FIG. 6.

FIG. 9 is an enlarged fragmentary cross-sectional view taken along the line 9—9 of FIG. 6.

While the invention is susceptible of various modifications and alternative constructions, a certain illustrated embodiment hereof has been shown in the drawings and will be described below in detail. It should be understood, however, that there is no intention to limit the invention to the specific form disclosed, but on the contrary, the intention is to cover all modifications, alternative constructions and equivalents falling within the spirit and scope of the invention.

DETAILED DESCRIPTION OF THE PREFERRED EMBODIMENT

For purposes of illustration, the present invention is shown in the drawings as embodied in an electric gearmotor 10 (FIG. 1) which, while suitable for many other purposes, is especially useful in vending machines that dispense candy, chips and other snack foods. As installed in a snack-food vending machine, the gearmotor 10 is coupled to a rotary dispensing mechanism, typically comprising a large helical feeder. When a particular snack is selected, the vending machine control circuit supplies electric power to the input terminals of the appropriate gearmotor to energize the electric motor. The motor then drives the gearmotor output shaft, thereby turning the helical feeder and dispensing the selected snack. A cam actuated switch mechanism, mounted on the gearmotor, signals the vending machine control circuit when the output shaft has rotated through one revolution. The vending machine control circuit then de-energizes the electric motor.

The present invention contemplates the provision of an electric gearmotor 10 with enhanced reliability and which, when compared to other gearmotors of the same general type, is relatively low in cost. Specifically, the gearmotor comprises a gearbox 11 (FIG. 2) having a generally hollow plastic gearbox housing 12, a gear train 14 mounted in the gearbox housing and an electrically insulating plastic gearbox cover 13. After all internal components have been assembled into the gearbox, the gearbox cover may be secured to the housing by any suitable means such as adhesive bonding, ultrasonic welding or by standard mechanical fasteners 15.

A d.c. electric motor 16 (FIG. 3) is mounted on the external surface 17 of the gearbox cover 13. Locating tabs 18 are integrally molded with, angularly positioned on and project outwardly from the external surface of the gearbox cover. The interior surface 19 of each tab 18 is generally formed in the shape of an arc so that the interior surfaces of the tabs cooperate to form a pocket 20 which snugly receives the end portion of the motor. When the motor is inserted into the pocket, electrical terminals 21 of the motor project inwardly, through openings 21A in the gearbox cover 13, into the interior of the gearbox 11. The rotary drive shaft 22 of the motor also projects inwardly through an opening 23 in the gearbox cover and is drivingly coupled to the input gear 14A of the gear train 14.

The gearmotor 10 includes a rotary output shaft 24 (FIG. 1) having a center portion 25 (FIG. 2), a drive end 26 (FIG. 1) and an opposite end 27. The center portion 25 of the output shaft is drivingly coupled to the output gear 28 (FIG. 2) of the gear train 14. The drive end 26 of the output shaft projects outwardly through an opening (not shown) in the gearbox housing 12 and is configured to drivingly couple to, for example, the helical feeder of a vending machine. The opposite end 27 of the output shaft projects outwardly through an opening 29 (FIG. 3) in the gearbox cover 13. A flattened cam surface 30 is formed on the end portion 31 of the output shaft that extends beyond the gearbox cover.

A switch assembly 32 is mounted on the external surface 17 of the gearbox cover 13. Locating posts 33 are integrally molded with and project from the external surface of the gearbox cover. As the switch assembly is mounted on the gearbox cover, openings 34 (FIG. 3) in the switch housing 35 slidably but snugly receive the locating posts while the switch actuating plunger 36 (FIG. 1) slidably engages the cam surface 30 on the output shaft 24. The switch terminals 37 project inwardly, through openings 38 in the gearbox cover, into the interior of the gearbox 11.

In carrying out the invention, a gearmotor control circuit 39 (FIG. 3) and the gearbox cover 13 are uniquely designed so that the control circuit is located internal to the gearbox 11, thereby protecting the control circuit from handling damage and damage resulting from exposure to the environment. Additionally, since the control circuit is electrically isolated inside the gearbox, electrical shorting between the control circuit and the metal back of the vending machine is precluded. As a result, overall gearmotor reliability is enhanced by the present invention.

More specifically, the internal surface 41 (FIG. 4) of the gearbox cover 13 is molded with a recessed area 42, sized to accept the control circuit 39 comprising a metal track 43 and electronic components 44 such as diodes, capacitors and resistors. Plastic posts 45 are molded integrally with the internal surface of the gearbox cover, projecting inwardly from the recessed area. As the track is located in the recessed area of the gearbox cover, openings 46 in the track slidably but snugly receive the locating posts 45. The track is then secured in place by ultrasonically or heat staking the posts 45 to form enlarged ends 45A (FIG. 7) on the posts.

The metal track 43 (FIG. 5) has been uniquely designed to reduce the cost of the gearmotor. First, the metal track eliminates the need for a costly printed circuit board by providing the electrical conductive path between the electrical power input terminals 60 (FIG. 6), the switch assembly terminals 37 (FIG. 3), the d.c. motor terminals 21 and the electrical component lead wires 57. Second, the metal track has been designed so that it embodies more than one control circuit 39 configuration. Electrical components 44 are used in the gearmotor control circuit for a variety of reasons. A blocking diode 44A may be included to protect the gearmotor from reverse polarity. Noise suppression diodes 44B or capacitors may be required in the circuit. The switch assembly may signal the vending machine control circuit that the feeder has traveled through one revolution by directly opening, shorting, or by causing a capacitor 44C to discharge to, an electrical line 61 that the vending machine control circuit monitors. The variety of vending machine control circuit interface options necessitates an equal variety of gearmotor control circuit configurations. The unique feature of the metal track permits a specific track design to be used in more than one type of gearmotor.

The track is fabricated using thin (approximately 0.02 inch) brass and comprises several strips and elongated portions of brass 58 (FIG. 5) to carry the electrical current. These strips and elongated portions 58 are interconnected by relatively narrow strips of brass 59. The relatively narrow strips 59 form the electrical junction points between the strips and elongated portions 58.

The metal track 43 is initially fabricated with a plurality of relatively narrow strips 59 interconnecting the strips and elongated portions 58 in several alternate electrical control circuit combinations. During assembly of the gearmotor 10, a metal track is mounted and secured into the recessed portion 42 of the cover 13. Then one or more of the relatively narrow strips 59, or knock-out tabs, are selectively removed, or pierced, thereby precluding electrical continuity at those junction points. The junctions that remain after the piercing operation define the electrical control circuit 39 for that gearmotor.

Formed in the metal track 43 are locking receptacles 47 having slots 48 for receiving the motor and switch terminals 21, 37. Initially, the size of the slot is smaller than the cross-sectional size of the terminal. When a terminal is inserted into a locking receptacle, one-way fingers 49, located on both ends of the slot, resiliently bend, allowing the terminal to enter the slot. As the terminal enters the slot, edges 50 of the one-way fingers act on the edges 51 of the terminal, permitting the terminal to further enter the slot but preventing the terminal from being removed from the slot. In this manner, the locking receptacles grab and hold the motor and switch assembly and establish electrical continuity between the terminals and the metal track.

Also formed integrally with the metal track 43 are crimping receptacles 55 (FIG. 9), having legs 56B, for receiving the electrical component lead wires 57. Initially, each crimping receptacle is generally V-shaped (FIG. 6), comprising a base 62 (FIG. 9) and two legs 56A having free ends 63. During assembly, an electrical component 44 is placed with each of its lead wires resting on the base 62 interposed between the two legs 56A. The free ends 63 of the legs 56A are then mechanically turned inwardly and towards the base, thereby crimping the component leads to the receptacle base and establishing electrical continuity between the electrical components and the metal track.

From the foregoing, it will be apparent that the present invention brings to the art a new and improved gearmotor in which the reliability has been significantly enhanced, at a reduced cost, over the prior art.

I claim:

1. An electric gearmotor for use in vending machines comprising:
    a gearbox having a gearbox housing, having a gearbox cover with an electrically insulating interior surface and having a gear train mounted in said gearbox;
    a rotary output shaft having a cam surface, said output shaft being rotatably mounted in said gearbox and being operably coupled to said gear train;
    an electrical control circuit enclosed within said gearbox, said control circuit comprising an electrically conductive metal track secured to said electrically insulating interior surface of said gearbox cover and further comprising a plurality of electrical components secured to said metal track in electrical continuity therewith;
    a switch assembly mounted on said gearbox cover exteriorly thereof and having an actuating mechanism operably engaging said cam surface of said output shaft, said switch assembly having at least two electrical terminals extending through said gearbox cover and secured to said metal track in electrical contact therewith; and
    an electric motor mounted on said gearbox cover exteriorly thereof and having a rotary drive shaft drivingly coupled to said gear train, said motor having at least two electrical terminals extending through said gearbox cover and secured to said metal track in electrical contact therewith.

2. An electric gearmotor as recited in claim 1, wherein said gearbox cover is molded from an electrically insulating plastic and further comprises a plurality of integral plastic posts extending inwardly from said interior surface of said cover and having enlarged free ends, and wherein said metal track further comprises a plurality of openings receiving said posts whereby said posts and openings coact to locate said metal track in said cover, and whereby said enlarged free ends secure said metal track to said cover.

3. An electric gearmotor as recited in claim 1, wherein said gearbox cover is molded from plastic and further comprises a pocket, said pocket receiving said electric motor, said cover including a plurality of integral plastic posts, and wherein said switch assembly further comprises a plurality of openings receiving said posts whereby said posts and openings coact to locate said switch assembly on said cover.

4. An electric gearmotor as recited in claim 1, wherein said metal track comprises at least two alternative electrical control circuit paths, each of said paths having at least one knock-out tab which may be selectively pierced so as to disable said path.

5. An electric gearmotor as recited in claim 1, wherein each of said electrical components further comprise at least two lead wires, and wherein said metal track further comprises a plurality of crimping receptacles, each of said crimping receptacles having a base and two ends, said ends being turned inwardly towards each other and towards said base whereby said base and said ends coact with said lead wires to secure said electrical components to said metal track in electrical contact therewith.

6. An electric gearmotor as recited in claim 1, wherein said metal track further comprises a plurality of locking receptacles, each of said locking receptacles having an opening, each of said openings having at least one curved side, each of said sides having at least one edge whereby said edges coact with said electrical terminals of said motor and switch assembly to secure said motor and said switch assembly to said metal track in electrical contact therewith.

* * * * *